United States Patent
Carroll et al.

(10) Patent No.: US 11,631,795 B2
(45) Date of Patent: Apr. 18, 2023

(54) NANOCOMPOSITE COMPRISING SEMICONDUCTOR AND METAL NANOPARTICLES, AND ASSEMBLIES

(71) Applicant: Wake Forest University, Winston-Salem, NC (US)

(72) Inventors: David L. Carroll, Winston-Salem, NC (US); Chaochao Dun, Winston-Salem, NC (US); Corey Hewitt, Winston-Salem, NC (US); Robert Summers, Clemmons, NC (US)

( * ) Notice: Subject to any disclaimer, the term of this patent is extended or adjusted under 35 U.S.C. 154(b) by 630 days.

(21) Appl. No.: 16/486,341

(22) PCT Filed: Feb. 16, 2018

(86) PCT No.: PCT/US2018/000041
§ 371 (c)(1),
(2) Date: Aug. 15, 2019

(87) PCT Pub. No.: WO2018/190919
PCT Pub. Date: Oct. 18, 2018

(65) Prior Publication Data
US 2020/0013939 A1    Jan. 9, 2020

Related U.S. Application Data

(60) Provisional application No. 62/459,978, filed on Feb. 16, 2017.

(51) Int. Cl.
*B32B 5/16*    (2006.01)
*B82Y 30/00*   (2011.01)
(Continued)

(52) U.S. Cl.
CPC ............ *H01L 35/26* (2013.01); *C01B 19/007* (2013.01); *H01L 35/34* (2013.01);
(Continued)

(58) Field of Classification Search
CPC .......................... B82Y 30/00; Y10T 428/2991
See application file for complete search history.

(56) References Cited

U.S. PATENT DOCUMENTS

| | | |
|---|---|---|
| 2007/0169810 A1 | 7/2007 | Van Duren et al. |
| 2007/0269991 A1 | 11/2007 | Jang et al. |
| | (Continued) | |

FOREIGN PATENT DOCUMENTS

| | | | |
|---|---|---|---|
| CN | 107452865 A | * 12/2017 | ............. B82Y 30/00 |
| WO | 2012087660 A2 | 6/2012 | |
| WO | 2016156265 A1 | 10/2016 | |

OTHER PUBLICATIONS

Wang et al., Efficient Plasmonic Au/CdSe Nanodumbbell for Photoelectrochemical Hydrogen Generation beyond Visible Region, Adv. Energy Mater. 2019, 9, 1803889 [DOI: 10.1002/aenm. 201803889] (Year: 2019).*

(Continued)

*Primary Examiner* — Hoa (Holly) Le
(74) *Attorney, Agent, or Firm* — Patent Grove AB; Tomas Friend

(57) ABSTRACT

Composite nanoparticle compositions and associated nanoparticle assemblies are described herein which, in some embodiments, exhibit enhancements to one or more thermoelectric properties including increases in electrical conductivity and/or Seebeck coefficient and/or decreases in thermal conductivity. In one aspect, a composite nanoparticle composition comprises a semiconductor nanoparticle including a front face and a back face and sidewalls extending between the front and back faces. Metallic nanoparticles are bonded to at least one of the sidewalls establishing a metal-semiconductor junction.

24 Claims, 14 Drawing Sheets

(51) Int. Cl.
  *H01L 35/26* (2006.01)
  *C01B 19/00* (2006.01)
  *H01L 35/34* (2006.01)

(52) U.S. Cl.
  CPC ...... *C01P 2002/72* (2013.01); *C01P 2002/85* (2013.01); *C01P 2002/88* (2013.01); *C01P 2004/03* (2013.01); *C01P 2004/04* (2013.01); *C01P 2004/24* (2013.01); *C01P 2004/80* (2013.01); *C01P 2006/32* (2013.01); *C01P 2006/40* (2013.01)

(56) References Cited

U.S. PATENT DOCUMENTS

| | | | |
|---|---|---|---|
| 2011/0100409 A1 | 5/2011 | Kim et al. | |
| 2013/0234375 A1 | 9/2013 | Ren et al. | |
| 2013/0284987 A1* | 10/2013 | Lee | H01L 35/34 977/773 |
| 2015/0200345 A1 | 7/2015 | Morelli et al. | |
| 2015/0243837 A1 | 8/2015 | Shim et al. | |
| 2016/0308107 A1* | 10/2016 | Talapin | H01B 1/06 |

OTHER PUBLICATIONS

Mohanchandra and Uchil, Electrical properties of CdS and CdSe films deposited on vibrating substrates, J. Appl. Phys., vol. 84, No. 1, Jul. 1, 1998 (Year: 1998).*
Zhong et al., The excellent TE performance of photoelectric material CdSe along with a study of Zn(Cd)Se and Zn(Cd)Te based on first-principles, RSC Adv., 2019, 9, 25471 (Year: 2019).*
Wikipedia, Seebeck Coefficient, 2000 (Year: 2000).*
International Search Report and Written Opinion corresponding to PCT/US2018/000041, dated Nov. 5, 2018, 9 pages.
Li, W. et al., Metal ions to control the morphology of semiconductor nanoparticles: copper selenide nanocubes, Journal of the American Chemical Society, vol. 135., No. 12. 2013, pp. 4664-4667.

* cited by examiner

NANOCOMPOSITE COMPRISING SEMICONDUCTOR AND METAL NANOPARTICLES, AND ASSEMBLIES

RELATED APPLICATION DATA

This application is a U.S. National Phase of PCT/US2018/000041, filed Feb. 16, 2018, which claims priority pursuant to Patent Cooperation Treaty Article 8 and 35 U.S.C. § 119(e) to U.S. Provisional Patent Application Ser. No. 62/459,978 filed Feb. 16, 2017, each of which is incorporated herein by reference in its entirety.

STATEMENT OF GOVERNMENT RIGHTS

This invention was made with government support under Grant No. FA9550-16-1-0328 awarded by the U.S. Air Force Office of Scientific Research and Grant No. 1123-SC-01-R0 NASA #NNX16CJ30P awarded by NASA/Streamline. The government has certain rights in the invention.

FIELD

The present invention relates to composite nanoparticles and associated assemblies and, in particular, to composite nanoparticles and assemblies exhibiting enhanced thermoelectric properties.

BACKGROUND

Solid-state energy conversion utilizing thermoelectric (TE) materials has attracted increasing interest due to their unparalleled properties to convert waste heat to electric energy. The efficiency of TE materials is expressed by a dimensionless figure of merit ZT, which is governed by electrical conductivity ($\sigma$), Seebeck coefficient (S), and thermal conductivity ($\kappa$) that mainly includes the lattice thermal conductivity $\kappa_L$ and carrier thermal conductivity $\kappa_c$ ($\kappa K_L \gg \kappa_c$). An ideal efficient TE material necessarily to possesses high $\sigma$ and a low $\kappa$. Unfortunately, for most TE systems, these three parameters are interdependent, thus maximizing one normally counteracts or reduces the other two. This has ultimately prevented the widespread application of TE materials as noise-free power generators or scalable solid-state Peltier coolers.

SUMMARY

Composite nanoparticle compositions and associated nanoparticle assemblies are described herein which, in some embodiments, exhibit enhancements to one or more thermoelectric properties including increases in electrical conductivity and/or Seebeck coefficient and/or decreases in thermal conductivity. In one aspect, a composite nanoparticle composition comprises a semiconductor nanoparticle including a front face and a back face and sidewalls extending between the front and back faces. Metallic nanoparticles are bonded to at least one of the sidewalls establishing a metal-semiconductor junction. In some embodiments, the metallic nanoparticles are bonded to a plurality of the semiconductor nanoparticle sidewalls establishing multiple metal-semiconductor junctions.

In another aspect, composite nanoparticle assemblies are described herein. Briefly, a composite nanoparticle assembly comprises semiconductor nanoparticles comprising front and back faces and sidewalls extending between the front and back faces, wherein spacing between the semiconductor nanoparticles is bridged by metallic nanoparticles bonded to the sidewalls of the semiconductor nanoparticles. As described further herein, the bridging metallic nanoparticles establish metal-semiconductor junctions with sidewalls of the semiconductor nanoparticles.

In a further aspect, methods of enhancing chalcogenide thermoelectric performance are provided. In some embodiments, a method of enhancing chalcogenide thermoelectric performance comprises providing chalcogenide nanoparticles comprising front and back faces and sidewalls extending between the front and back faces. At least one of electrical conductivity and Seebeck coefficient of the chalcogenide nanoparticles is increased via nucleation of metallic nanoparticles on the sidewalls, wherein the metallic nanoparticles bridge spacing between the chalcogenide nanoparticles. Moreover, thermal conductivity of the chalcogenide nanoparticles can be decreased by the metal nanoparticles bridging spacing between adjacent nanoparticles.

These and other embodiments are described in greater detail in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Figure 14:
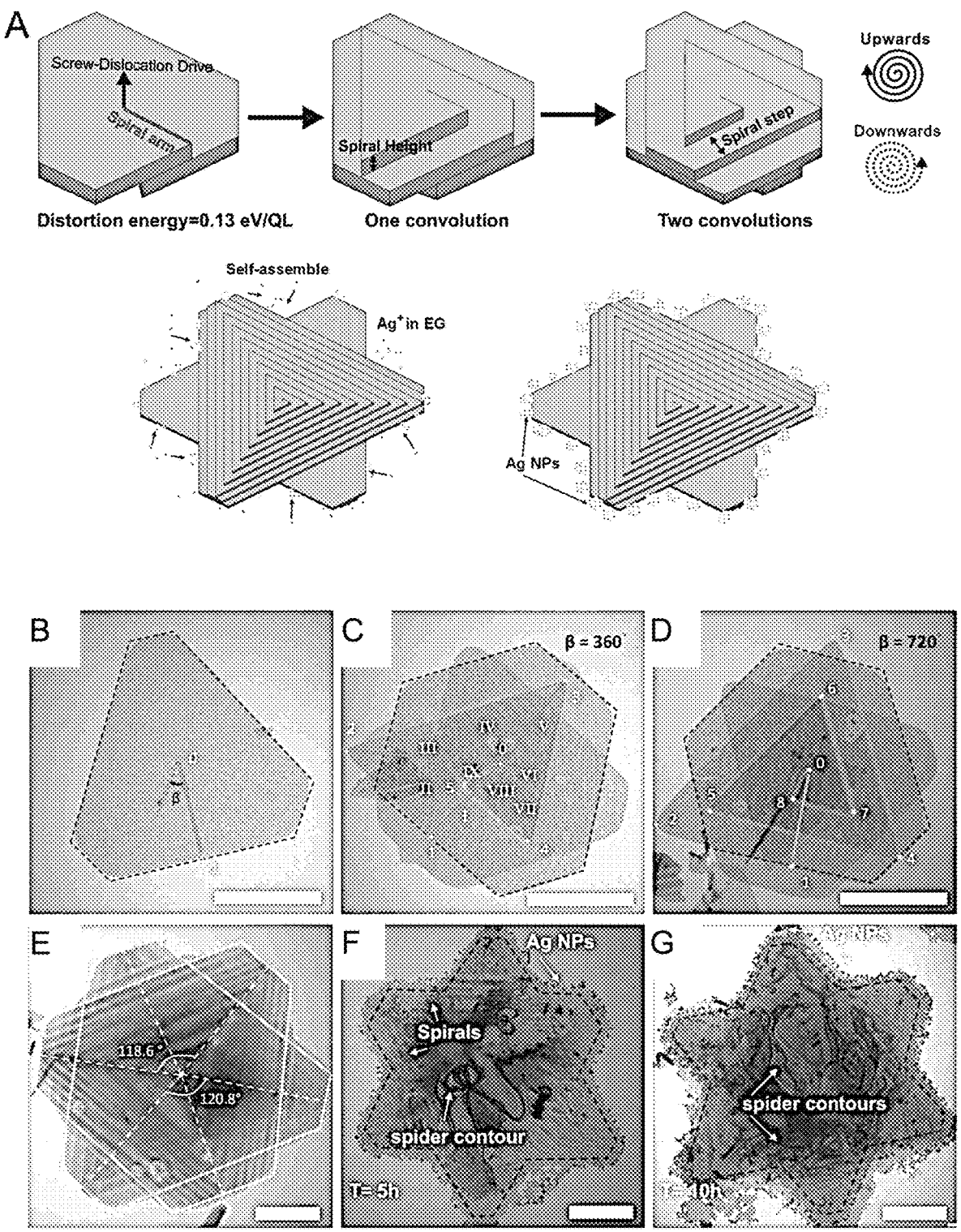
FIG. 14 illustrates pyramidal or bi-pyramidal morphology of semiconductor nanoparticles according to some embodiments described herein.

In one aspect, a composite nanoparticle composition comprises a semiconductor nanoparticle including a front face and a back face and sidewalls extending between the front and back faces. Metallic nanoparticles are bonded to at least one of the sidewalls establishing a metal-semiconductor junction. In some embodiments, the metallic nanoparticles are bonded to a plurality of the semiconductor nanoparticle sidewalls establishing multiple metal-semiconductor junctions. The semiconductor nanoparticle can comprise any semiconductor not inconsistent with the thermoelectric principles and electronic structures described herein. Suitable semiconductor nanoparticles can include various chalcogenides, such as metal sulfides, metal selenides and/or metal tellurides. Moreover, semiconductor nanoparticles can be p-type or n-type. For example, semiconductor nanoparticles can comprise molybdenum sulfide ($MoS_2$), antimony telluride ($Sb_2Te_3$) or bismuth telluride ($Bi_2Te_3$). Additionally, semiconductor nanoparticles of the composite composition can exhibit any particle morphology presenting sidewalls for bonding and/or nucleation of the metallic nanoparticles. In some embodiments, semiconductor nanoparticles have two-dimensional (2D) morphology. A semiconductor nanoparticle, for example, can be a platelet wherein the metal nanoparticles are bonded to one or more sidewalls of the platelet. Semiconductor nanoparticles, in some embodiments, exhibit a pyramidal or bi-pyramidal structure. Non-limiting examples pyramidal or bi-pyramidal structures are illustrated in FIG. 14.

Metallic nanoparticles bonded to one or more sidewalls of a semiconductor nanoparticle can comprise any metal not inconsistent with the thermoelectric principles and electronic structures described herein. Suitable metals include various transition metals, such as metals selected from Groups IVA-VIIIA and Group IB of the Periodic Table. In some embodiments, the metallic nanoparticles are formed of noble metal(s). The metal nanoparticles can nucleate and self-assemble on sidewall surfaces of the semiconductor nanoparticles. In being bonded to the semiconductor nanoparticle sidewall, an interfacial transition region can be established between the metal nanoparticle and semiconductor. In some embodiments, the interfacial transition region comprises metal atoms chemically bonded to atoms of the semiconductor nanoparticle. In one example, silver nanoparticles are bonded to sidewalls of a $Sb_2Te_3$ nanoparticle, wherein an interfacial transition region comprises $Sb_2Te_3$—$Ag_2Te$—Ag. Metal nanoparticles bonded to semiconductor sidewalls can have any size not inconsistent with the objectives of the present invention. In some embodiments, metal nanoparticle size is governed by spacing between the semiconductor nanoparticles in a composite assembly. As described further herein, the metal nanoparticles can bridge spacing between adjacent semiconductor nanoparticles, binding to sidewalls of the semiconductor nanoparticles. In such embodiments, composite nanoparticle assemblies can be formed.

Figure 1B:
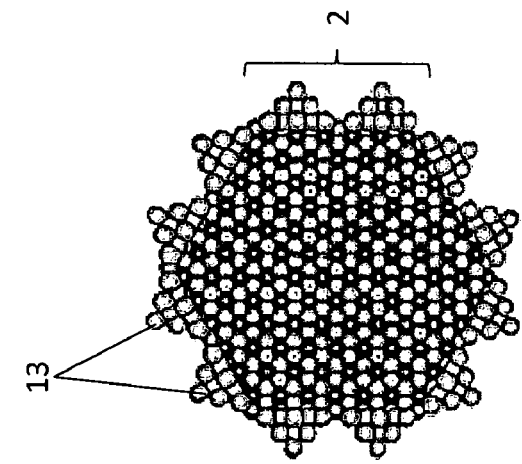
FIG. 1B illustrate metallic nanoparticles bonded to sidewalls of the platelet semiconductor nanoparticle according to some embodiments.
Figure 1A:
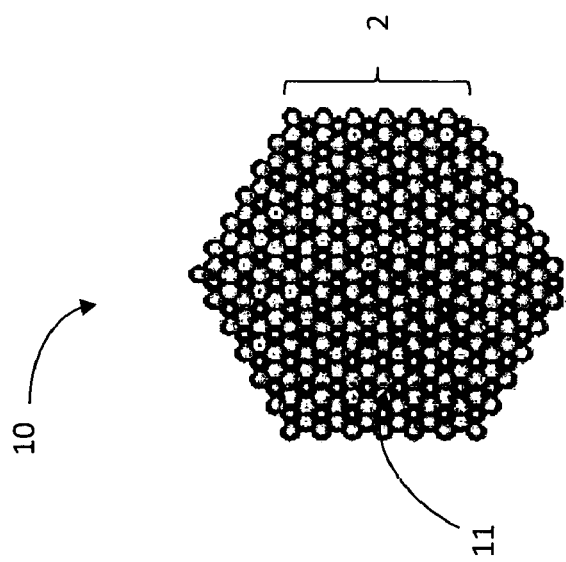
FIG. 1A illustrates a top plan view of a platelet semiconductor nanoparticle according to some embodiments.

FIG. 1A illustrates a top plan view of a $Bi_2Te_3$ nanoparticle having platelet morphology according to some embodiments described herein. The $Bi_2Te_3$ nanoparticle 10 comprises a front face 11 and an opposing back face (not shown). Sidewalls 2 extend between the front face 11 and back face. FIG. 1B illustrates metallic nanoparticle 13 nucleation and growth on sidewalls 2 of the $Bi_2Te_3$ nanoparticle 10.

Figure 2A:
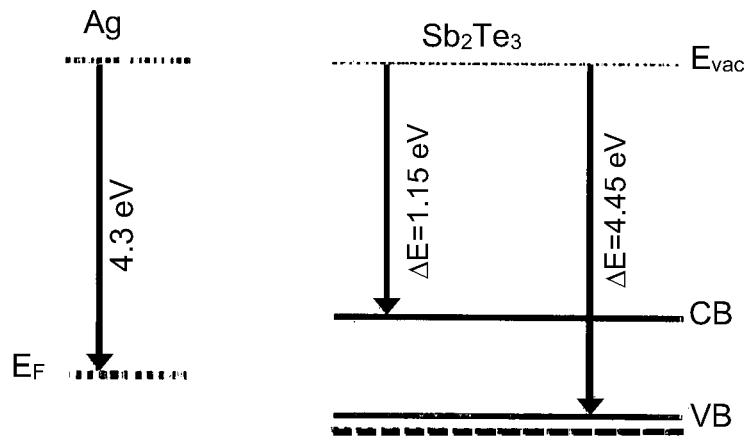
FIG. 2A illustrate band structure of $Sb_2Te_3$ nanoparticle and Ag metal according to some embodiments.
Figure 2B:
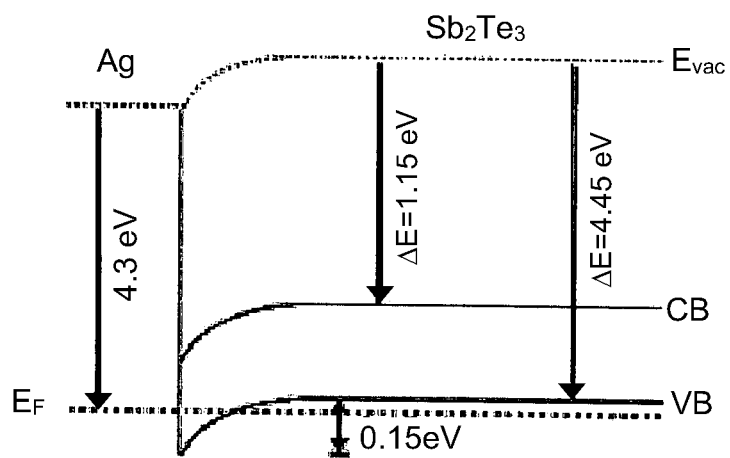
FIG. 2B illustrate band structure of an Ag nanoparticle-$Sb_2Te_3$ nanoparticle interface according to some embodiments.

Bonding and growth of metallic nanoparticles on sidewalls of the semiconductor establishes a metal-semiconductor junction. In some embodiments, a Schottky barrier is formed at the metal semiconductor junction. FIG. 2A illustrates the band diagram of a $Sb_2Te_3$ nanoparticle prior to nucleation and growth of silver nanoparticles along one or more sidewalls. The work function of silver is also illustrated in FIG. 2A. Before contact, the initial Fermi level of Ag is located above the intrinsic $Sb_2Te_3$. After nucleation and growth, the presence of Ag nanoparticles pins the effective Fermi level of the present nanocomposites around the work function of silver due to the large carrier density in the metallic layer. As can be seen in FIG. 2B, the blend band gap between the host $Sb_2Te_3$ semiconductor and metallic Ag nanoparticles forms a Schottky barrier, which is believed to be much better than Ohmic contact. Moreover, the potential barrier height (~150 meV) is around the theoretical optimized height of 100 meV. Therefore, interfaces in Ag—$Sb_2Te_3$ nanoplates induce energy-dependent carrier scattering by introducing a Schottky barrier to filter carriers with low energy, i.e. the carrier filtering technique prevents the transport of the lower-energy carriers, which results in an increase in the moment of the differential conductivity about the Fermi level.

Figure 3:
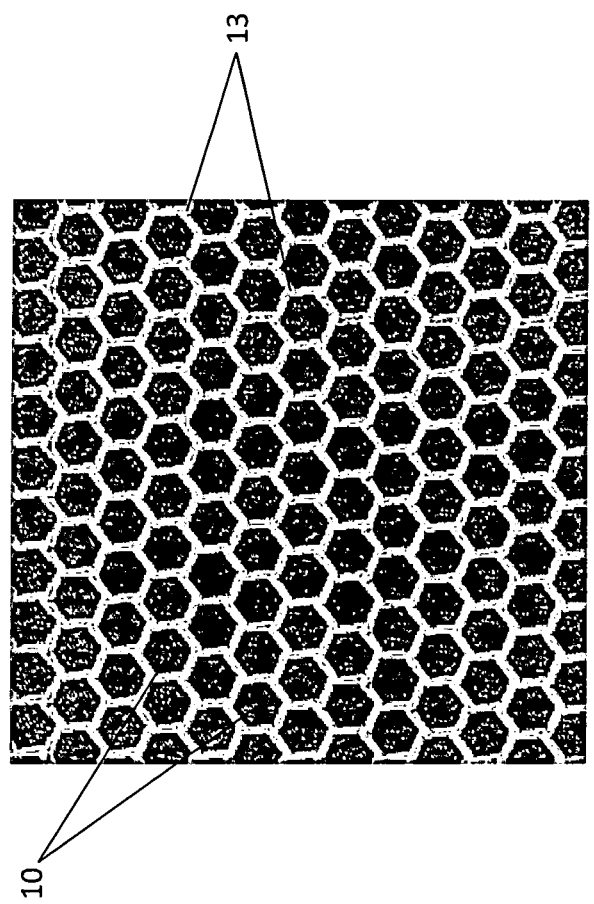
FIG. 3 illustrates a composite nanoparticle assembly according to some embodiments.

The metallic nanoparticles bridge spacing between adjacent semiconductor nanoparticles to provide composite nanoparticle assemblies. A metal nanoparticle, for example extends from a sidewall of a first semiconductor nanoparticle to bond to a sidewall of a second adjacent semiconductor nanoparticle. When occurring over multiple sidewalls, nanocomposite assemblies are formed as illustrated in FIG. 3. Spacing between the platelet $Sb_2Te_3$ nanoparticles 10 is filled with metallic nanoparticles 3 bound to sidewalls of the $Sb_2Te_3$ nanoparticles. Schottky barriers can be established at metal-semiconductor interfaces along the sidewalls permitting filtering of low energy carriers as described herein. Filtering of the low energy carriers can enhance electrical conductivity of the composite nanoparticle assembly. In some embodiments, a nanocomposite assembly has an electrical conductivity of at least $1 \times 10^4$ S/m or at least $1 \times 10^5$ S/m. Additionally, the metal nanoparticles can enhance phonon scattering, thereby lowing thermal conductivity of the nanocomposite assembly. Seebeck coefficient of the semiconductor nanoparticles can also be improved by the presence of the metal nanoparticles. In some embodiments, a nanocomposite assembly has a room temperature Seebeck coefficient of at least 140 µV/K. The foregoing enhancements also increase the power factor of composite nanoparticle assemblies described herein. In some embodiments, a nanoparticle assembly has a power factor greater than 600 µW/mK² or a power factor greater than 1000 µW/mK².

Figure 13:
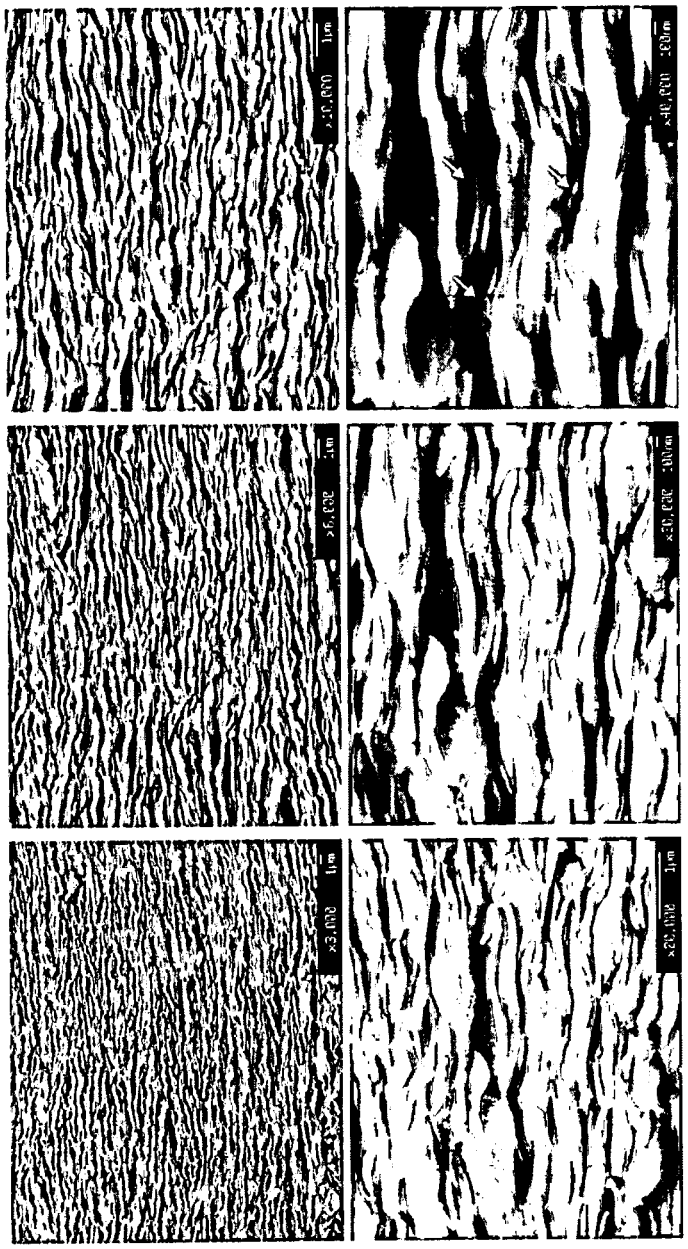
FIG. 13 provides scanning electron microscopy images of pellet based $Bi_2Te_3$ nanoplates after Ag decoration at different magnifications according to some embodiments.

Composite nanoparticle assemblies can be formed into thin flexible films for various thermoelectric applications. Composite nanoparticle assemblies, in some embodiments, are stacked to provide thin film architectures. Cross-sectional structure of the stacked composite assemblies can include porosity or open spaces between composite nanoparticle assemblies. Such porosity and/or open spaces are illustrated in FIG. 13. FIG. 13 provides scanning electron microscopy (SEM) images of pellet based $Bi_2Te_3$ nanoplates after Ag decoration at different magnifications according to some embodiments.

In a further aspect, methods of enhancing chalcogenide thermoelectric performance are provided. In some embodiments, a method of enhancing chalcogenide thermoelectric performance comprises providing chalcogenide nanoparticles comprising front and back faces and sidewalls extending between the front and back faces. At least one of electrical conductivity and Seebeck coefficient of the chalcogenide nanoparticles is increased via nucleation of metallic nanoparticles on the sidewalls, wherein the metallic nanoparticles bridge spacing between the chalcogenide nanoparticles. Moreover, thermal conductivity of the chalcogenide nanoparticles can be decreased the metal nanoparticles bridging spacing between adjacent nanoparticles.

These and other embodiments are further illustrated in the following non-limiting examples.

EXAMPLE 1—Composite Nanoparticle Assembly

V-VI $Sb_2Te_3$ was selected because of its state-of-the-art performance that exhibits the highest ZT near 50° C. Silver was chosen as the metallic nanoparticle phase due to its low work function (4.26-4.9 eV) needed for efficient carrier injection into the $Sb_2Te_3$ conduction band. In detail, using the ultrathin/active $Sb_2Te_3$ edge as the nucleation sites, Ag can be reduced from $AgNO_3$ in ethyl alcohol (EG) at room temperature. As a result, Ag nanoparticles with diameters around 40 nm were found to grow uniformly at the edge of the $Sb_2Te_3$ nanoplates.

Actually, a slight layer of second phase (n-type $Ag_2Te$) was also introduced in this process. These interfaces among $Sb_2Te_3$—$Ag_2Te$—Ag act as a low-energy carrier and phonon scattering center, which facilitates the enhancement of the Seebeck coefficient (from 84 to 103 μV/K) and the suppression of thermal conductivity. Meanwhile, the electrical conductivity was also improved from $4.4×10^3$ to $3.5×10^4$ S/m due to the increased carrier concentration with a slight decrease of carrier mobility. This simultaneous enhancement of electrical conductivity and Seebeck coefficients demonstrates that these self-assembled Ag nanoparticles are able to inject charge carriers and facilitate charge transport between $Sb_2Te_3$ nanoplates; at the same time, the generated the energy barrier among Ag nanoparticles, the introduced $Ag_2Te$ second phase and $Sb_2Te_3$ nanoplatelets also assist in blocking charge carriers with lower energy, facilitate the decoupling of the Seebeck coefficient and electrical conductivity.

Figure 4:
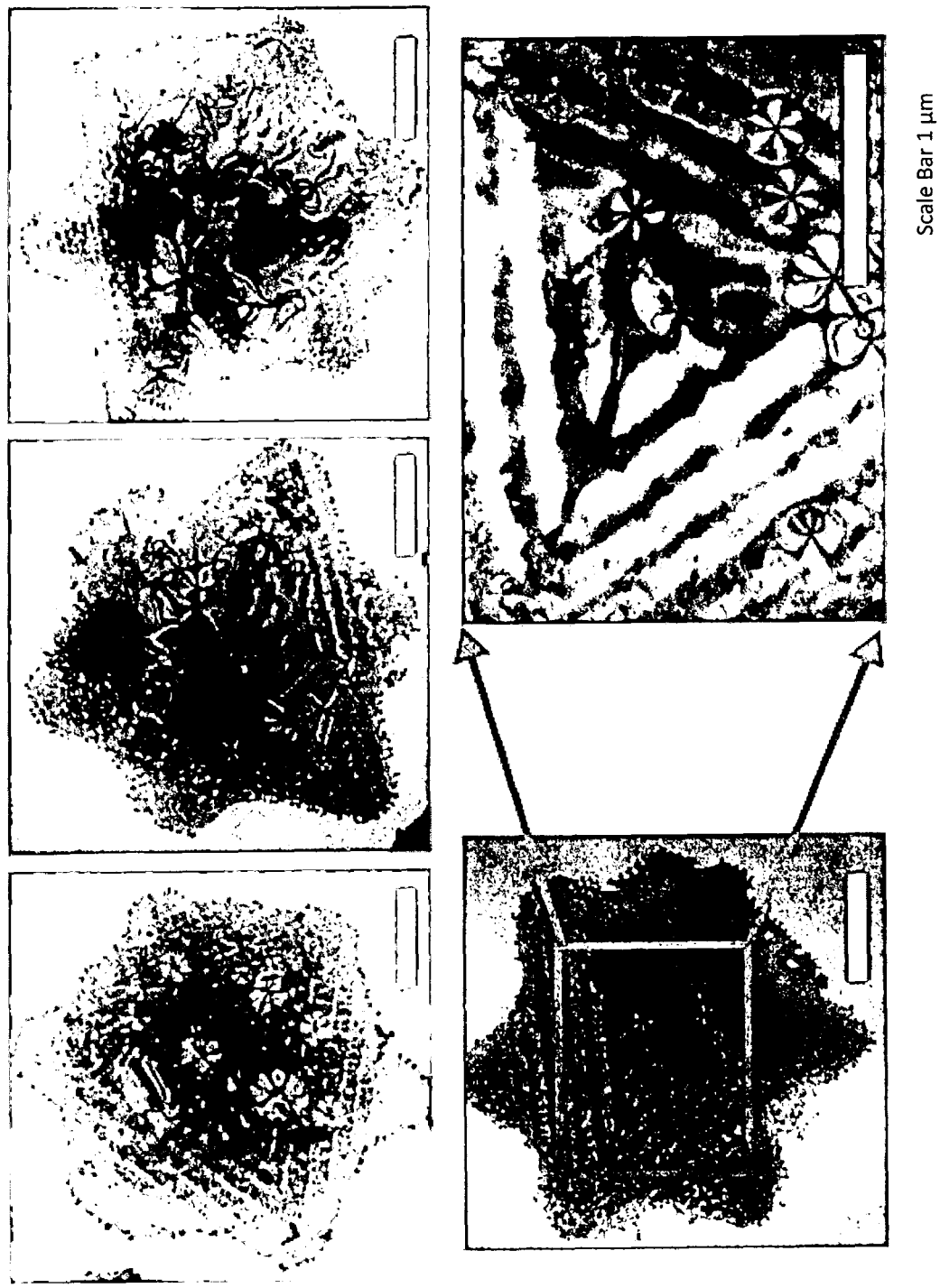
FIG. 4 illustrates transmission electron microscopy (TEM) images of composite nanoparticles according to some embodiments.
Figure 5:
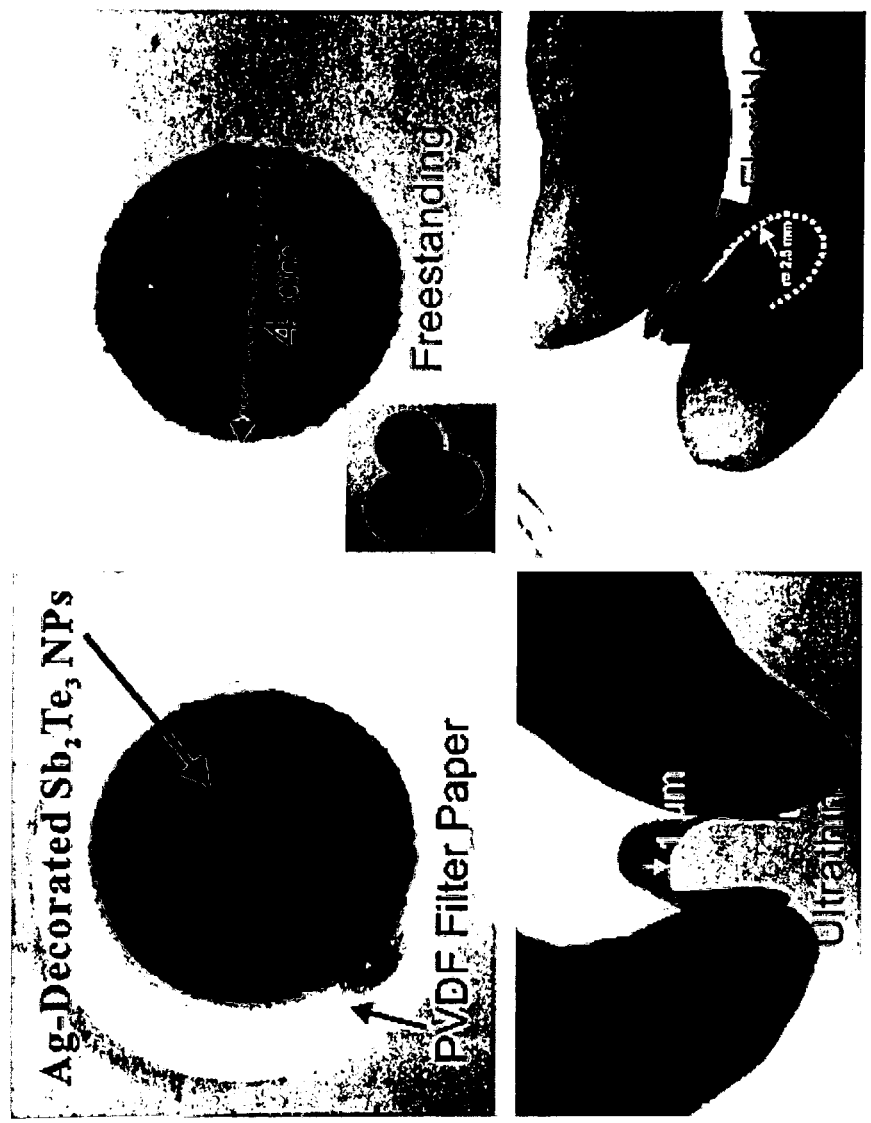
FIG. 5 illustrates a freestanding composite nanoparticle assembly film according to some embodiments.

In a typical synthesis, 70 ml ethylene glycol (EG) solution containing mixed antimony trichloride ($SbCl_3$, 6 mmol), tellurium dioxide ($TeO_2$, 9 mmol), sodium hydroxide (NaOH, 1.5 g), and polyvinylpyrrolidone (PVP, $M_s≈40000$ g/mol, 0.8 g) are heated to 120° C. 10 ml hydrazine hydrate ($N_2H_4$) was injected (with injection rate 2.5 ml/min), and the solution were maintained at 130° C. for 3 hours. After which, the mixture are heated at 155° C. under reflux for another 15 hours. The precipitates were collected by centrifugation, washed using ethanol for at least three times. Finally, a simple and efficacious vacuum filtration process is adopted to fabricate the $Sb_2Te_3$-based thin film using water as solution. In details, the $Sb_2Te_3$-based nanocomposites were dispersed in water via homogenization and sonication, subsequently, the resulting aqueous suspension was vacuum-filtered through a poly(vinylidene difluoride) (PVDF) filter (0.1 μm pore size) to form a silver gray film (shiny metallic appearance) on the filter surface. The fabricated thin film can finally be transform to different substrates (like Silicon or PET) for different applications. For the fabrication of Ag-decorated $Sb_2Te_3$ nanocomposites, 1 mmol as-fabricated $Sb_2Te_3$ was dispersed in 70 mL EG, and proper amount of $AgNO_3$ was added with gently and stirred over night at room temperature. The precipitates were collected by centrifugation, washed using ethanol for at least three times. Finally, the vacuum filtration process is adopted to fabricate the flexible thin film based on Ag-decorated $Sb_2Te_3$ using water as solution. Ag nanoparticles with high uniformity were observed to embed regularly around the edges of the $Sb_2Te_3$ nanoplates, as evidenced by TEM images of FIG. 4. Freestanding flexible Ag-decorated $Sb_2Te_3$ thin film is illustrated in FIG. 5.

Figure 6:
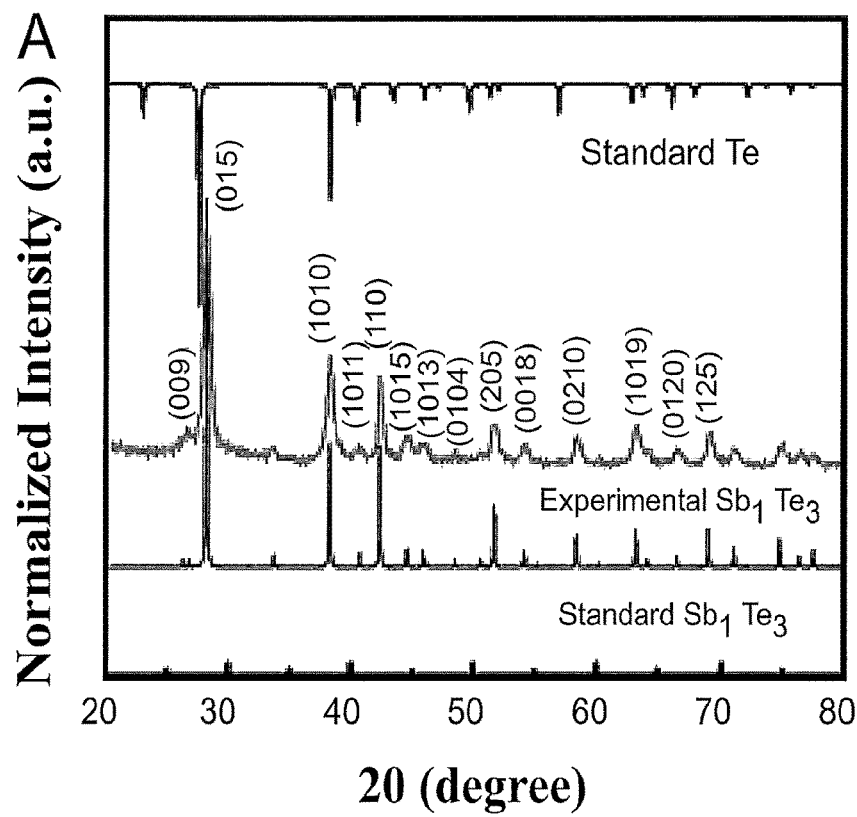
FIG. 6 illustrates X-ray diffraction measurements of $Sb_2Te_3$ nanoplates and $Sb_2Te_3$ nanoplates having silver nanoparticles bound to sidewalls according to some embodiments.
Figure 6:
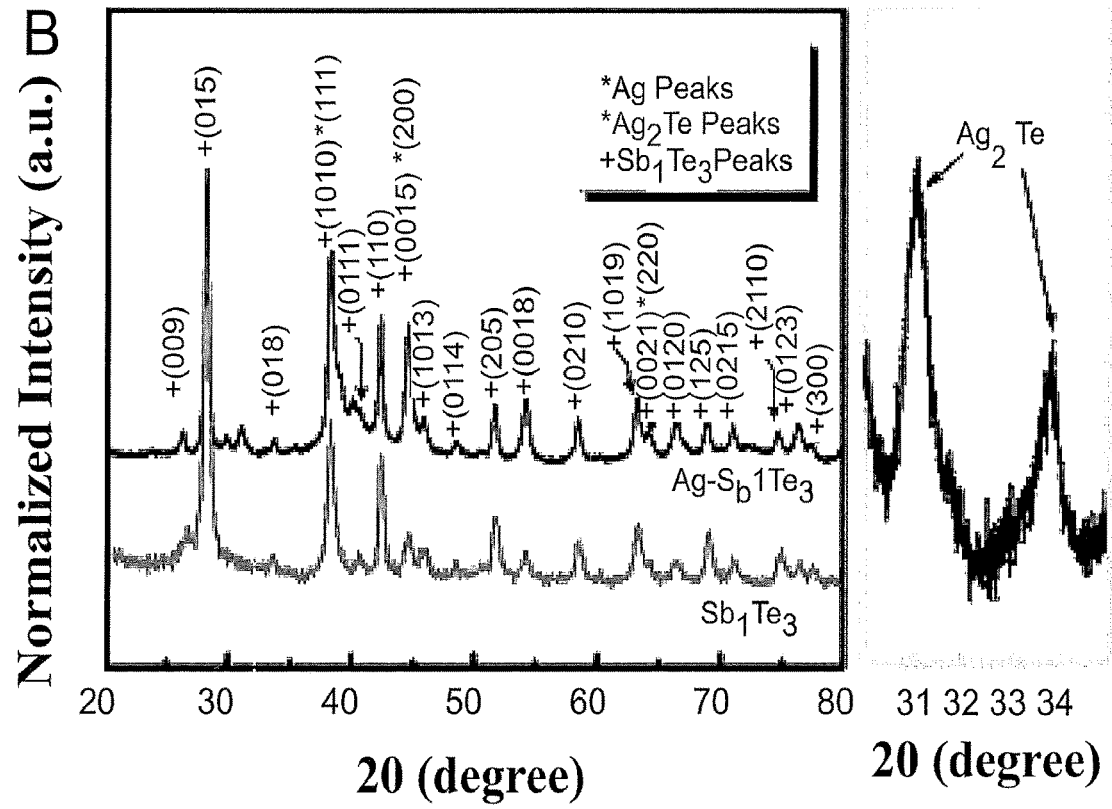
Figure 7:
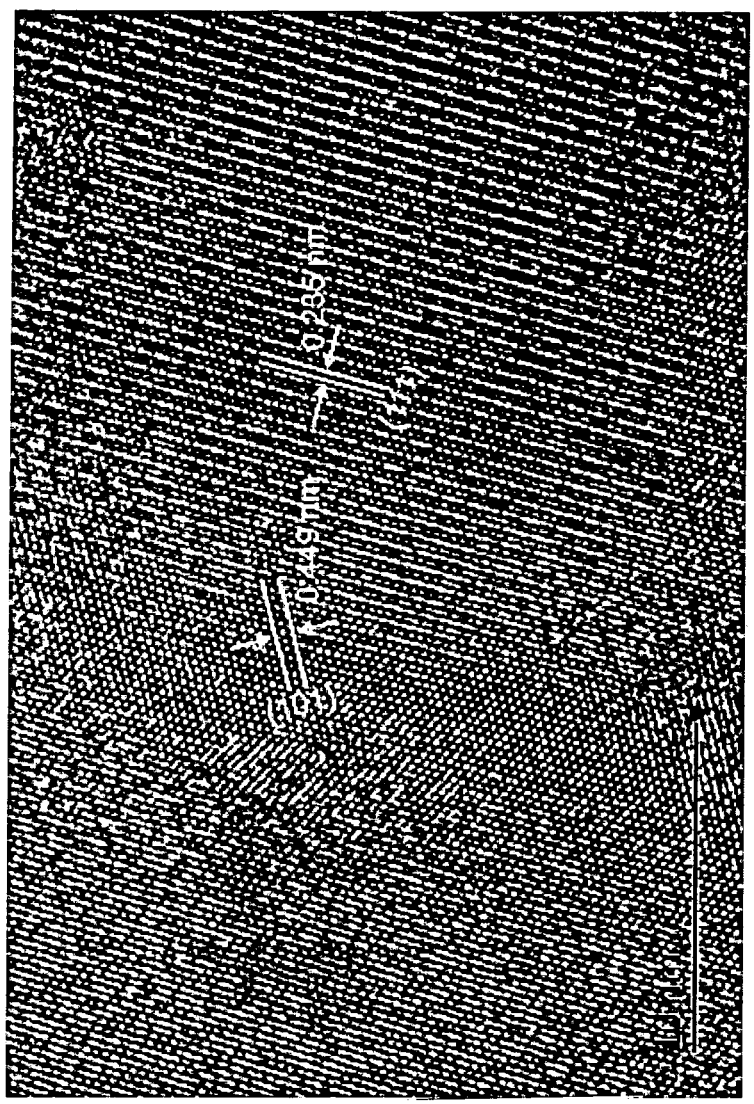
FIG. 7 illustrates a high resolution TEM image of a composite nanoparticle according to some embodiments.
Figure 8:
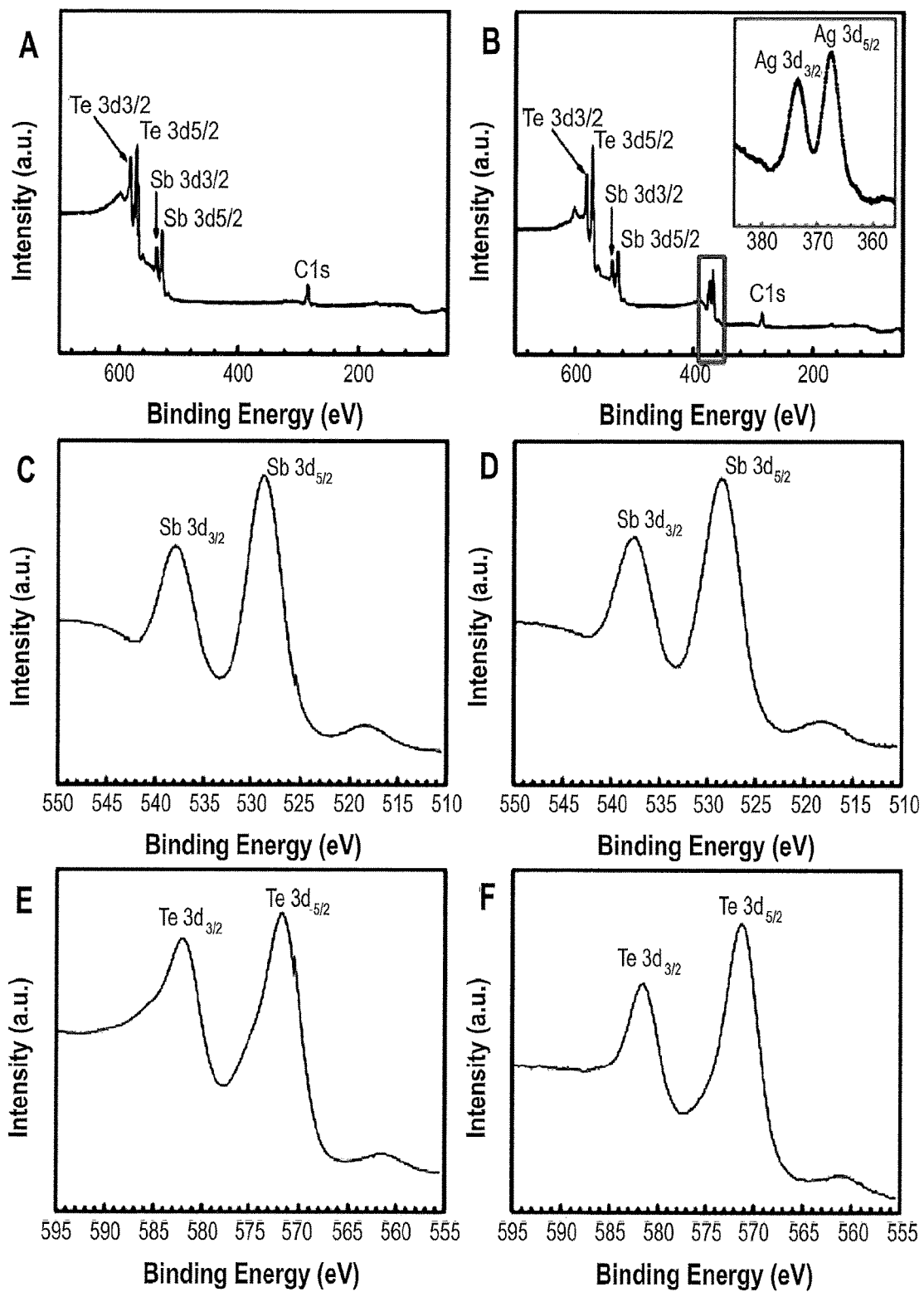
FIG. 8 illustrates XPS of $Sb_2Te_3$ and Ag-decorated $Sb_2Te_3$ conducted to study the chemical environment of each element.
Figure 9:
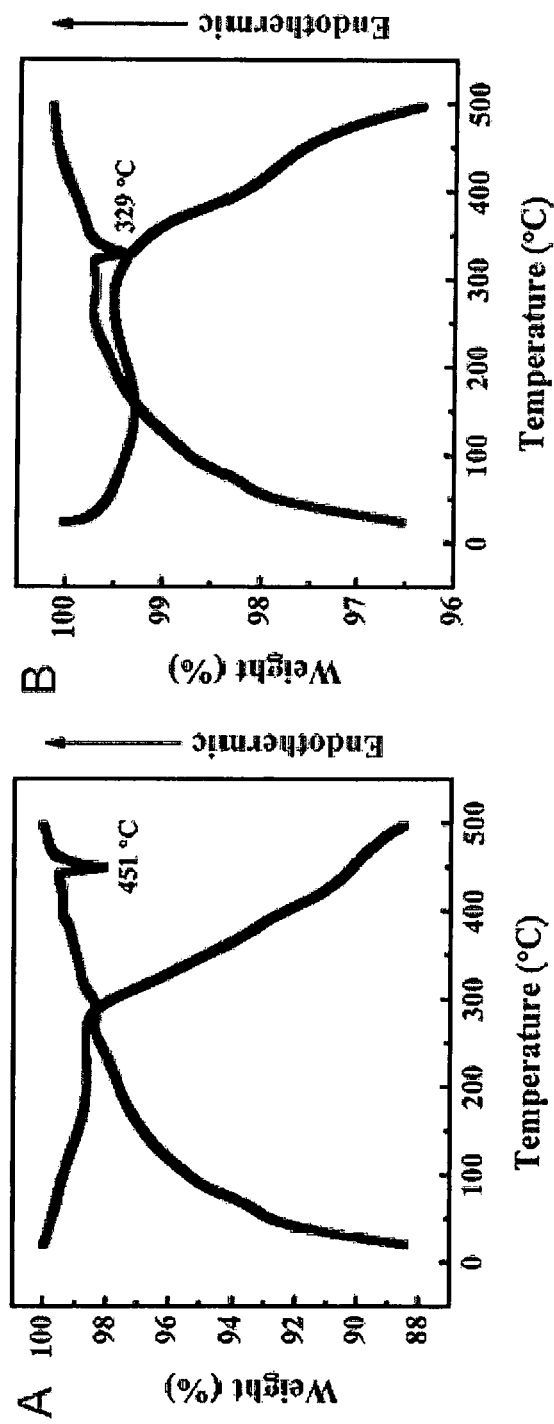
FIG. 9 illustrates TGA and DSC analyses of $Sb_2Te_3$ nanoplates and Ag-decorated $Sb_2Te_3$ nanoplates according to some embodiments.

The active $Sb_2Te_3$ edges with exposed Te dangling bonds are believed to act as heterogeneous nucleation sites, first reacting with $Ag^+$ and then facilitating the growth of Ag nanoparticles with the help of a reducing agent (EG). No dissociate Ag nanoparticles were found in the solution (dynamically unstable) or on the surface of the $Sb_2Te_3$ nanoplates, suggesting that laterally selective growth is more preferable (calculated as –0.113 eV/Å$^2$ compared with –0.037 eV/Å$^2$ that growth on the face). The strain in the crystal lattice is beneficial to the decrease of the lattice thermal conductivity contribution by strain field scattering. By using XRD measurement, a slight amount of $Ag_2Te$ was also found beyond Ag (peaks 29.8° and 31° that corresponds to the main peak of monoclinic phase $Ag_2Te$), which likely occurs in the beginning of nucleation as illustrated in FIG. 6. That is in agreement with the slight layer (~3 nm) of second phase (n-type $Ag_2Te$, P2/n, and PDF No. 34-0142) observed by HRTEM in FIG. 7, implying the uniformly generated $Sb_2Te_3$—$Ag_2Te$—Ag interfaces. Here, by using self-assembled nanoengineering, a uniform p-n junction was generated around each $Sb_2Te_3$ nanoplate, which might be one of the main reasons this unique heterojunction has extremely high electrical conductivity while maintaining a decent Seebeck coefficient. XPS of $Sb_2Te_3$ and Ag-decorated $Sb_2Te_3$ have been conducted to study the chemical environment of each element as provided in FIG. 8. The $3d_{3/2}$ and $3d_{5/2}$ peaks of Ag are located at 373.40 and 367.8 eV, respectively. Interestingly, a slight shoulder peak appears in the $Sb_2Te_3$ sample due to the oxidation states of Te compared to the sharp peak of the Ag-decorated $Sb_2Te_3$ sample. This means the oxidative stability of the nanocomposites is strengthened after Ag-decoration. TGA and DSC analyses of $Sb_2Te_3$ nanoplates and Ag-decorated $Sb_2Te_3$ nanocomposites are also given in FIG. 9.

Ag-decorated $Sb_2Te_3$ nanocomposites possess significantly higher electrical conductivities around $3.5×10^4$ S/m, which is eight times larger than that of the $Sb_2Te_3$ based thin film and even comparable to the bulk $Sb_2Te_3$ pellet. At the same time, the Seebeck coefficient also increases from 84 to 103 μV/K at 300 K (>20%) after nanoengineering. As a result, with the enhanced electrical conductivity and improved Seebeck coefficient, Ag-decorated $Sb_2Te_3$ nanocomposite based films give a power factor of 371 μW/mK$^2$, which is much higher than our previous $Bi_2Se_3$-based thin films and other $Sb_2Te_3$-based films. The electrical conductivity and Seebeck of the present films exhibited high stability against the bending test, demonstrating no apparent change in performance upon repeated bending for up to 500 cycles under bending radius 2 mm. The boost in performance results from the simultaneously enhanced electrical conductivity and Seebeck coefficients. Here, the enhanced electrical conductivity is explained by an efficient injection of carriers from the metallic Ag to the conduction band of the $Sb_2Te_3$ semiconductor. To clarify the above mechanism, a room temperature hall measurement was performed, which reveals a remarkable increase in carrier concentration from $1.4 \times 10^{19}$ $cm^{-3}$ to $9.9 \times 10^{19}$ $cm^{-3}$ with a slight decrease of mobility from 25 to 22 $cm^2V^{-1}S^{-1}$, as can be seen in Table 1. This is also in agreement with the estimated results from the increase of equivalent conductivity (in unit of the relaxation time τ) for Ag-decorated $Sb_2Te_3$ nanocomposites compared with Ag-free $Sb_2Te_3$ based on first-principles calculations.

introduced self-assembled heterojunction architectures, leading to a dramatically increased power factor for the present flexible thermoelectric fabrics. Further, to roughly estimate the thermal conductivity of the present system, we made samples with thickness around 100μ. The room temperature thermal conductivity of Ag-decorated $Sb_2Te_3$ nanocomposites was determined around 0.44 W/m·K, which gives a ZT of 0.23.

EXAMPLE 2—Composite Nanoparticle Assembly

Fabrication of n-Type $Bi_2Te_3$ Nanoplates

In order to fabricate $Bi_2Te_3$ nanoplates, 2 mmol $Bi(NO_3)_3$ and 3 mmol $Na_2TeO_3$ was dissolved in 70 mL ethylene glycol, 1.5 g NaOH was added with vigorous stirring, and

TABLE 1

Carrier concentrations and carrier motilities $Sb_2Te_3$ based or $Sb_2Te_3$ related nanostructures based thin films at 300 K.

| Materials | Carrier Concentration ($\times 10^{19}$ $cm^{-3}$) | Mobility ($cm^2V^{-1}S^{-1}$) | Seebeck (μV/K) | Electrical Conductivity (S/m) | Power Factor (μW/mK$^2$) |
|---|---|---|---|---|---|
| $Sb_2Te_3$ | 1.67 | 28 | 116 | $7.3 \times 10^3$ | 96 |
| Pt—$Sb_2Te_3$ | 2.46 | 11.4 | 152 | $4.4 \times 10^3$ | 102 |
| $Sb_2Te_3$ | | | | | |
| Annealed 420 K | 1.5 | 14 | 124 | $3.9 \times 10^3$ | 60 |
| Annealed 470 K | 1.7 | 26 | 114 | $7.0 \times 10^3$ | 91 |
| $Ag_xTe_y$—$Sb_2Te_3$ $Ag_{31}Sb_{19}Te_{50}$ | 8.9 | 4.1 | 135 | $5.6 \times 10^3$ | 102 |
| $Ag_xTe_y$—$Sb_2Te_3$ $Ag_{34}Sb_{18}Te_{48}$ | 11 | 5.8 | 93 | $1.07 \times 10^4$ | 93 |
| $Sb_2Te_3$[a] | 1.4 | 25 | 84 | $5.6 \times 10^3$ | 40 |
| Ag—$Sb_2Te_3$[a] | 9.9 | 22 | 103 | $3.5 \times 10^4$ | 371 |

[a]The results in the present work without annealing.

A beneficial energy barrier is introduced between the metallic nanoparticles and semiconductor nanoplates to maintain a decent Seebeck coefficient. The band alignment between $Sb_2Te_3$ and Ag nanoparticles is shown in FIGS. 2A and 2B. The detailed electrical information of $Sb_2Te_3$ and the work function of silver nanoparticles (~4.3 eV) are taken from experiments. The assumption of bulk is reasonable since the thickness of the bottom layer of $Sb_2Te_3$ is around 10 nm, which corresponds to 10 QL. The Fermi level ($E_F$) is positioned near the top of valence band maximum with a small gap at the Γ-point according to previous study. Before contact, the initial Fermi level of Ag is located above the intrinsic $Sb_2Te_3$. After Ag decoration, the presence of Ag nanoparticles pins the effective Fermi level of the present nanocomposites around the work function of silver due to the large carrier density in the metallic layer. As can be seen, the blend band gap between the host $Sb_2Te_3$ semiconductor and metallic Ag nanoparticles forms a Schottky barrier, which is believed to be much better than Ohmic contact. Moreover, the potential barrier height (~150 meV) is around the theoretical optimized height of 100 meV. Therefore, interfaces in Ag—$Sb_2Te_3$ nanoplates induce energy-dependent carrier scattering by introducing a Schottky barrier to filter carriers with low energy, i.e. the carrier filtering technique described above is preventing the transport of the lower-energy carriers, which results in an increase in the moment of the differential conductivity about the Fermi level.

In summary, increasing the electrical conductivity while maintaining or even enhancing the Seebeck coefficient by chopping the distribution cold carriers is achieved with the followed by 0.5 g polyvinylpyrrolidone (PVP, $M_s \approx 40000$ g/mol) and refluxing the mixture solution at 185° C. over night. After the mixture cool down to room temperature, Acetone was used to precipitate the fabricated $Bi_2Te_3$ nanoplates and then re-dissolve by Ethanol. This process was repeated three times to remove any unreacted chemicals and ethylene glycol from the surface.

Fabrication of p-Type $Sb_2Te_3$ Nanoplates

In a typical synthesis, 70 ml ethylene glycol (EG) solution containing mixed antimony trichloride ($SbCl_3$, 6 mmol), tellurium dioxide ($TeO_2$, 9 mmol), sodium hydroxide (NaOH, 1.5 g), and polyvinylpyrrolidone (PVP, $M_S \approx 40000$ g/mol, 0.8 g) are heated to 120° C. 10 ml hydrazine hydrate ($N_2H_4$) was injected (with injection rate 2.5 ml/min), and the solution were maintained at 130° C. for 3 hours. After which, the mixture are heated at 155° C. under reflux for another 15 hours. The precipitates were collected by centrifugation, washed using ethanol for at least three times to remove any unreacted chemicals and ethylene glycol from the surface.

Fabrication of Self-Assembling Ag Decorated $Bi_2Te_3$ and $Sb_2Te_3$ nanoplates For the fabrication of Ag-decorated $Bi_2Te_3$/$Sb_2Te_3$, 1 mmol as-fabricated $Bi_2Te_3$/$Sb_2Te_3$ was dispersed in 70 mL EG, and proper amount of $AgNO_3$ was added with gently and stirred over night at room temperature. The precipitates were collected by centrifugation, washed using ethanol for at least three times. The fabrication of Cu-decorated $Bi_2Te_3$/$Sb_2Te_3$ is similar as that of Ag, except CuI/CuCl was used to with a reaction temperature around 60° C. This synthesis protocol enabled a high batch-to-batch reproducibility and a high material yield larger than 90%.

Bulk Nanomaterial Consolidation

The dried nanocomposites were loaded into a graphite die and compacted into pellets (Ø10 mm×~1.5 mm). The process was carried out in Ar atmosphere, using a custom-made hot press to simultaneously apply a pressure of 70 MPa and a temperature of 370-380° C. during 30 min. In this system, the heat was provided by an induction coil operated at 30-80 KHz and it was applied directly to a graphite die acting as a susceptor. Fast heating ramps of 20° C. s$^{-1}$ are reached by this method with a 25 kW induction heater. All the pellets were mechanically robust enough to endure polishing.

Characterization

The synthesized $Bi_2Te_3$ nanoplates (powder and bulk) were analyzed by X-ray diffraction (XRD) using Cu Kα radiation with a scanning step 0.01° (λ=1.5418 Å, Bruker D2 Phaser). Transmission Electron Microscope (TEM) and High Resolution TEM techniques including the selected area electron diffraction (SAED) images were performed using a JEM-2100 electron microscope. Element mapping and energy dispersive X-ray spectroscopy (EDX) were also performed. The morphology and thickness of single NPs were measured by the Atomic Force Microscope (AFM). X-ray photoelectron spectroscopy (XPS) were used to study the quality. The morphology of the $Bi_2Te_3/Sb_2Te_3$ nanoplates and Ag-decorated $Bi_2Te_3/Sb_2Te_3$ nanocomposites (cross section and top-view) were measured by the Scanning Electron Microscope (SEM, JEOL, JSM-6330F). The Thermogravimetric (TG) and differential scanning calorimetric (DSC) were measured with a TG-DTA/DSC thermal analyzer (Netzsch, Germany) with a heating rate of 10° C./min in flowing $N_2$ gas.

For the measurement of thermoelectric properties, Seebeck coefficients were measured using a static DC method, and electrical resistivity data was obtained by a standard four-probe method. Both the Seebeck coefficient and the electrical resistivity were measured simultaneously in a LSR-3 LINSEIS system in the temperature range between room temperature and 600 K, under helium atmosphere. At each temperature at least three consecutive measurements were performed to get rid of the minor variations. Taking into account the system accuracy and the measurement precision, we estimate an error of ca. 4% in the measurement of the electrical conductivity and Seebeck coefficient. The thermal diffusivity coefficient (D) was measured between 300-600 K by the A XFA 600 Xenon Flash apparatus from Linseis. The heat capacity ($C_p$) was measured using differential scanning calorimetry (DSC, Netzsch DSC-404C) with an associated error of ca. 2%. The thermal conductivity was calculated from the expression $κ=DC_p d$, where d is the density of the sample. The density (ρ) was determined using the dimensions and mass of the sample and then reconfirmed using the Archimedes method. The Hall coefficient ($R_H$) was determined using a physical properties measurement system (PPMS-9T) under a magnetic field of 2T and electrical current. The carrier concentration (n) was calculated as $n=1/eR_H$, where e is the proton charge. The Hall mobility $μ=R_H aσ$, where σ is the electrical resistivity.

Figure 10A:
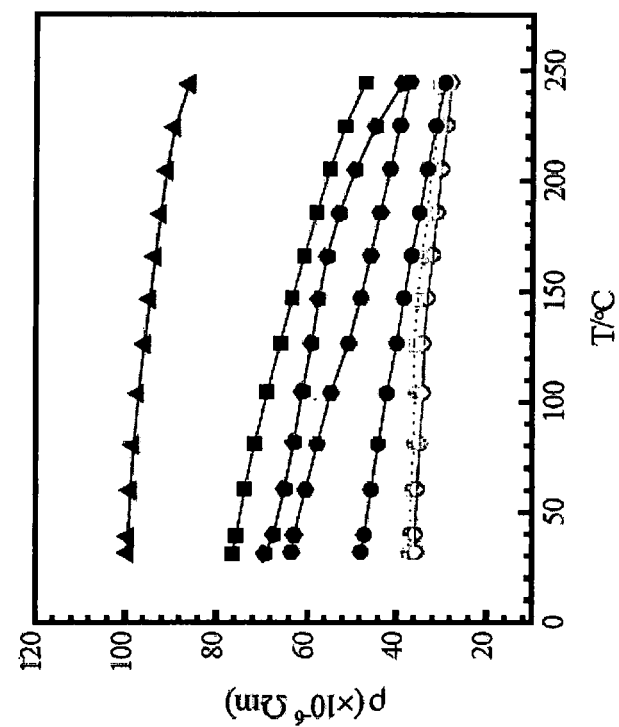
FIG. 10A illustrates temperature dependent electrical properties of Ag-decorated $Bi_2Te_3$ pellets with different Ag concentrations.
Figure 10B:
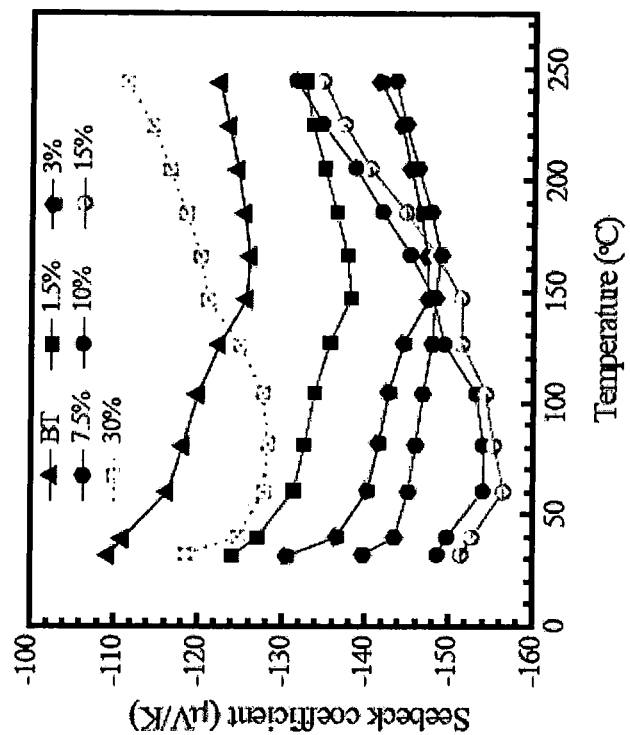
FIG. 10B illustrates temperature dependent thermal transport properties of Ag-decorated $Bi_2Te_3$ pellets with different Ag concentrations.
Figure 11:
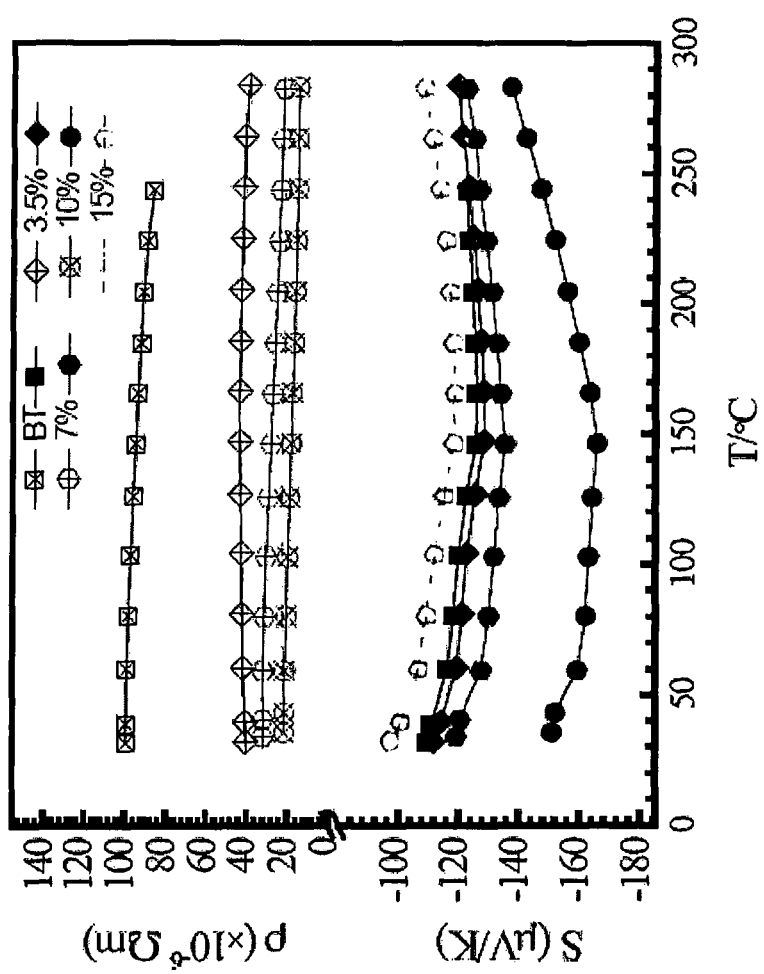
FIG. 11 illustrates temperature dependent electrical and thermal transport properties of Cu-decorated $Bi_2Te_3$ pellets with different Cu concentrations.

To determine the effect of self-assembled metal nanoparticles on thermoelectric (TE) performance of these nanocomposites, temperature dependent electrical and thermal transport properties for a series of metal-decorated $Bi_2Te_3$ pellets are provided. FIG. 10A illustrates temperature dependent electrical properties of Ag-decorated $Bi_2Te_3$ pellets with different Ag concentrations. FIG. 10B illustrates temperature dependent thermal transport properties of Ag-decorated $Bi_2Te_3$ pellets with different Ag concentrations. FIG. 11 illustrates temperature dependent electrical and thermal transport properties of Cu-decorated $Bi_2Te_3$ pellets with different Cu concentrations. The concentrations of Ag or Cu on $Bi_2Te_3$ nanoplates can be fine-adjusted by $AgNO_3$ or CuI/CuCl precursors. Typically, metal-free $Bi_2Te_3$ exhibits a relatively low electrical conductivity (σ around $1.0×10^4$ S/m at room temperature (RT). One reason for this low value compared with $Bi_2Te_3$ ingot is the thermal degradation residue from the capping PVP ligand. The σ gradually increases with the self-assembled metallic nanoparticles. For example, nanocomposites with 15 at % Ag exhibit a significantly increased σ up to $2.8×10^4$ S/m at RT, which is nearly three times compared with pure $Bi_2Te_3$. With temperature, all the nanocomposites show a nondegenerate semiconductor behavior, i.e. the σ increases slightly with the temperature over the studied measurement range 300-550 K. This is in agreement with the nanostructured $Bi_2Te_3$ observed previously. This behavior can be attributed to the thermal excitation carrier concentrations (n) across the band gap and the increased extrinsic n with the increasing temperature.

At the same time, it is interesting to see a simultaneous 35% increase in S (negative) with the decorated nanoparticles, which enhances from 110 to 150 μV/K at RT for Ag-free $Bi_2Te_3$ and Ag-decorated $Bi_2Te_3$, respectively. This causes the power factor ($PF=σS^2$) keeping increasing until the amount of Ag reaches 15%, with a champion value of 650 μW/mK$^2$ at RT. Further increase of Ag failed to enhance the σ. This is likely caused by the increased micro-voids in the nanocomposite due to the different Young's modulus between Ag (83 GPa) and $Bi_2Te_3$ (50 GPa), or the introduced impurities on the surface of the nanoplates instead of the lateral edges (See the saturated density, the cross section SEM images of Ag-decorated $Bi_2Te_3$ and the generated XRD patterns in Figure SI). In short, with the decoupled σ and S, the overall PF exhibits a five times increase for the nanocomposites over the original $Bi_2Te_3$.

For Cu-decorated $Bi_2Te_3$ system, this decoupled phenomenon is similar but become much more strengthened, i.e. the absolute value of S shows a 35% increase from 110 to 150 μV/K as the content of Cu increases, meanwhile, the σ enhanced dramatically from $1×10^4$ to $4.6×10^4$ S/m (with Cu concentration around 10 at %). Therefore, the highest PF of Cu-decorated $Bi_2Te_3$ reaches 1060 μW/mK$^2$ at RT, which is nearly nine times higher than the original $Bi_2Te_3$. The maximum PF of 1530 μW/mK$^2$ at 160° C. was achieved for the Cu-decorated $Bi_2Te_3$ containing 10 at % Cu.

Figure 12:
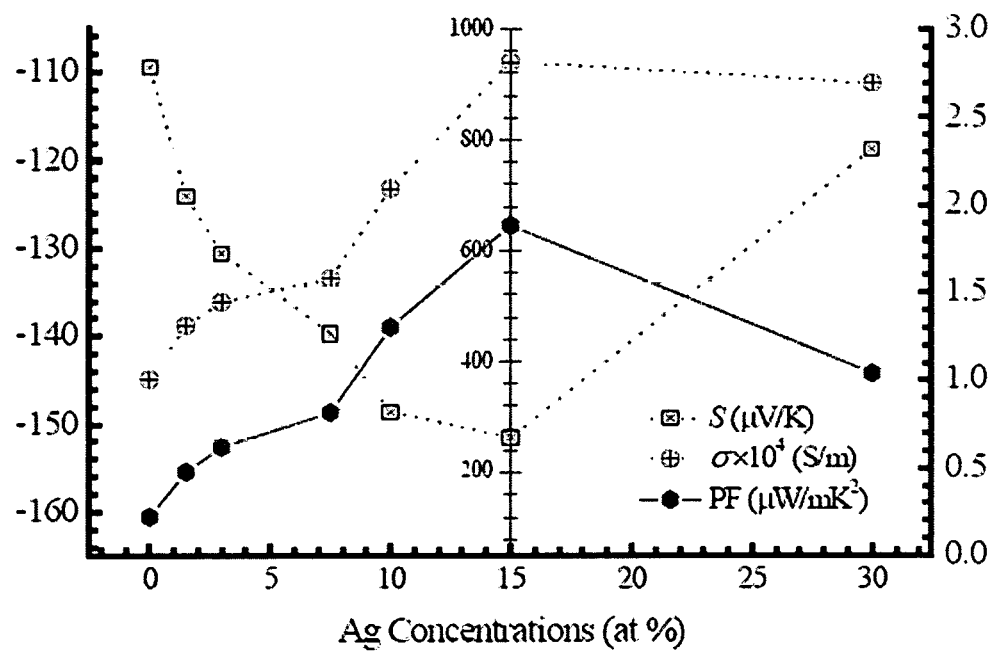
FIG. 12 summarizes the room temperature (RT) performance for both Cu- and Ag-decorated $Bi_2Te_3$.
Figure 12:
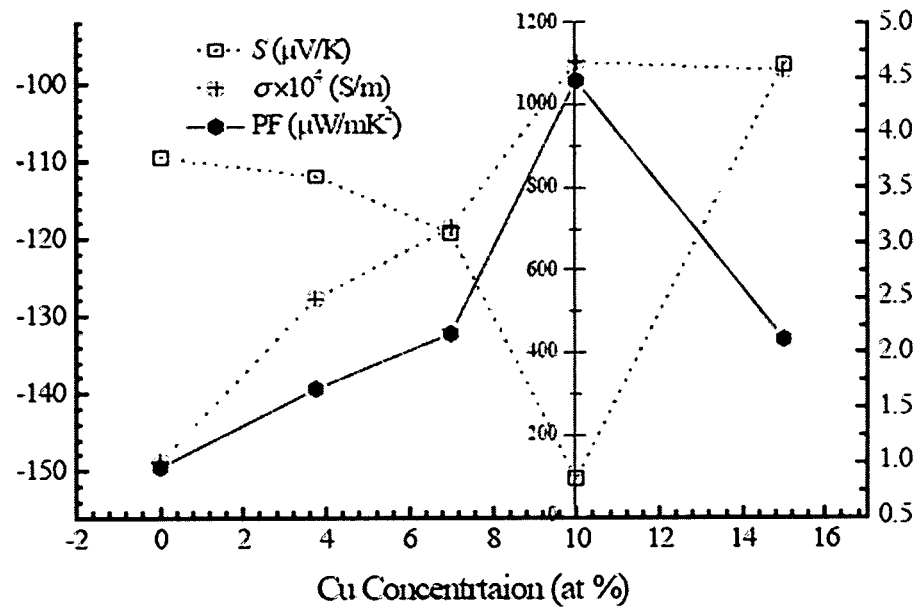

The RT electrical performance for both Cu- and Ag-decorated $Bi_2Te_3$ were summarized in FIG. 12, demonstrating obviously decoupled σ and S i.e. the S and σ increase in parallel with the introduced self-assembled heterojunction architectures. This noticeable trend is fundamentally different to the coupled relationship between the σ and S in traditional inorganic systems with multiphases, in which two or more phases are either simply mixing together after separately synthesized or combined by the traditional doping strategy. In most previous reports, the addition of a second phase results in an increased σ with a decreased S or vice versa. To explore the detailed mechanism behind this, Hall Effect measurement results were studied at RT. First of all, compared with the Ag-free $Bi_2Te_3$ matrix, a gradual increase in carrier concentrations (n) in the Ag-decorated $Bi_2Te_3$ nanocomposites was observed. In other words, nanocomposites with self-assembled metal nanoparticles increases the n, which partially compensating the reduced μ. In general, S tends to decrease with the increased n. For the present self-assembled heterojunction system, the parallel enhancement of σ and S might arise from the simultaneous occurrence of parabolic bands across the Fermi surface and flat bands near the Fermi surface of $Bi_2Te_3$. Meanwhile, the interactions among the electron-electron, electron-phonon, and the porous three dimensional structure that is distinct from the tightly stacked bulk materials can also contribute to the increased S.

Energy filtering effect is normally qualitatively to explain the increased S by based on simple band gap alignment. However, introduced chemical bonding at the interface plays important roles in determining the electrical band structures and the Schottky-barrier height (SHB), thus detailed first principles calculations involved in a more accurate treatment of the interface dipole is necessary. Here, DFT calculations were carried out in order to uncover the mechanism behind the decoupled phenomenon. On one hand, from the increased electrical conductivity (σ=neμ) discussed above, the introduced metal nanoparticles are capable to inject charge carriers and facilitate promising efficient charge transport across neighboring nanoplates and the whole pellet. On the other hand, as the phonon scattering in nanostructured materials is strongly dependent on the numerous interfaces between the nanostructures, the self-assembled metal nanoparticles might also assist in blocking phonon propagation that transport large fraction of heat. This interface scattering in nanostructures originated from the enhanced phonon boundary scattering and the low energy electrons filtering, with which the compression of $κ_L$ is expected. Nanoscale precipitates and mesoscale grains acting as multi-wavelength phonon scattering centers were indeed preserved. Based on the Rayleigh scattering regime, the scattering cross section is defined as $σ \sim b^6/λ^4$, where b and λ are the size of the scattering particles and phonon wavelength, respectively. Here, the size of the Ag nanoparticles is around 40 nm, which is sufficiently large enough to create a scattering regime that does not overlap Rayleigh scattering on the atomic scale (~1 Å). Therefore, both Ag/Cu nanoparticles and the second phase $Ag_2Te/Cu_2Te$ are thought to assist in blocking propagation of phonons with mid to long wavelengths that transport a large fraction of heat; thus, significantly reducing $κ_L$ in nanocomposites is achieved.

The temperature dependence of κ and RT $κ_L$ for the nanocomposites confirm the self-assembled heterojunction has a great influence on the thermal transport. Since bipolar thermal conductivity is negligible near RT, $κ_L$ is calculated from the difference between κ and $κ_e$ ($κ_e$=LσT, where L is the Lorentz number calculated using Fermi integral function. The calculation details are provided in SI). As a result of the low density, the thermal conductivity of Ag-free $Bi_2Te_3$ pellet (0.35 $W·m^{-1}·K^{-1}$) is much lower than that of ingot $Bi_2Te_3$ (1.5-2 $W·m^{-1}·K^{-1}$). It is seen that $κ_L$ shows a continuous decrease with Ag concentrations, which is ( ) and ( ) for Ag-free $Bi_2Te_3$ and Ag-decorated $Bi_2Te_3$ at RT, respectively. These values lie within the minimum range of lattice thermal conductivity (0.1-0.2 $W·m^{-1}·K^{-1}$) defined by Slack[21]. The overall increase in κ resulted from the associated increase of the electronic contribution. Similar trend was also observed in Cu-decorated $Bi_2Te_3$ system, with a relatively low $κ_L$ for the champion sample. In other words, a considerable reduction $κ_L$ was achieved with the introduced self-assembled metal nanoparticles arising from the lattice mismatch/bending and the difference of lattice vibrations between the host semiconductor and the decorated nanoparticles around the grain boundaries. Taking advantages of the enhanced PF and the suppressed κ, the resulted thermoelectrical ZT is increased from 0.1 to 0.3 via the present heterojunction architectures for Ag-decorated $Bi_2Te_3$. For the Cu-decorated $Bi_2Te_3$ system, the ZT is optimized to 0.3 at RT.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A composite nanoparticle composition comprising:
    a semiconductor nanoparticle including a front face and an opposing back face and sidewalls extending between the front and back faces; and
    metallic nanoparticles bonded to at least one of the sidewalls establishing a metal-semiconductor junction;
    wherein the opposing sidewalls of the nanoparticle are separated by a distance of more than 1.0 μm.

2. The composite nanoparticle of claim 1, wherein the metallic nanoparticles are bonded to a plurality of the sidewalls establishing multiple metal-semiconductor junctions.

3. The composite nanoparticle of claim 1, wherein a Schottky barrier is established at the metal-semiconductor junction.

4. The composite nanoparticle of claim 3, wherein the Schottky barrier has a height of at least 100 meV.

5. The composite nanoparticle of claim 1, wherein the semiconductor nanoparticles is a chalcogenide.

6. The composite nanoparticle of claim 5, wherein the metallic nanoparticles are formed of one or more transition metals.

7. The composite nanoparticles of claim 6, wherein the one or more transition metals are selected from Groups IV A-VIIIA and Group IB of the Periodic Table and a noble metal.

8. The composite nanoparticle of claim 1, wherein the semiconductor nanoparticle is a platelet.

9. The composite nanoparticle of claim 1, wherein the metallic nanoparticles have a diameter of around 40 nm.

10. The composite nanoparticle of claim 1, further comprising an interfacial transition region between the semiconductor nanoparticle and metallic nanoparticles and wherein the interfacial transition region comprises metal atoms chemical bonded to atoms of the semiconductor nanoparticle.

11. The composite nanoparticle of claim 10, wherein the interfacial transition region comprises $Sb_2Te_3$—$Ag_2Te$—Ag.

12. A composite nanoparticle assembly comprising:
    semiconductor nanoparticles comprising opposing front and back faces and sidewalls extending between the front and back faces,
    wherein opposing sidewalls of the semiconductor nanoparticles are separated by a distance of greater than 0.1 μm and
    wherein spacing between the semiconductor nanoparticles is bridged by metallic nanoparticles bonded to the sidewalls of the semiconductor nanoparticles.

13. The composite nanoparticle assembly of claim 12, wherein the bridging metallic nanoparticles establish metal-semiconductor junctions with the sidewalls of the semiconductor nanoparticles.

14. The composite nanoparticle assembly of claim 13, wherein Schottky barriers are established at the metal-semiconductor junctions.

15. The composite nanoparticle assembly of claim 14, wherein the Schottky barriers have a height of at least 100 meV.

16. The composite nanoparticles assembly of claim 12, wherein the semiconductor nanoparticles are chalcogenides.

17. The composite nanoparticles assembly of claim 16, wherein metallic nanoparticles are formed of one or more transition metals.

18. The composite nanoparticle assembly of claim 17, wherein the one or more transition metals are selected from Groups IVA-VIIIA and Group IB of the Periodic Table and a noble metal.

19. The composite nanoparticle assembly of claim 16 having an electrical conductivity of at least $1 \times 10^4$ S/m.

20. The composite nanoparticles assembly of claim 16 having a room temperature Seebeck coefficient of at least 140 μV/K.

21. The composite nanoparticle assembly of claim 16 having a power factor greater than 600 μW/mK$^2$.

22. The composite nanoparticles assembly of claim 16 having a power factor greater than 1000 μW/mK$^2$.

23. The composite assembly of claim 12, wherein the semiconductor nanoparticles are platelets.

24. The composite assembly of claim 12, wherein the metallic nanoparticles have a diameter of around 40 nm.

* * * * *